United States Patent [19]

Machida et al.

[11] Patent Number: 5,377,679
[45] Date of Patent: Jan. 3, 1995

[54] MAGNETIC RESONANCE IMAGING SYSTEM

[75] Inventors: Yoshio Machida; Masahiko Hatanaka, both of Nishinasunomachi; Shinichi Kitane, Ootawara, all of Japan

[73] Assignee: Kabushiki Kaisha Toshiba, Kawasaki, Japan

[21] Appl. No.: 796,924

[22] Filed: Nov. 22, 1991

Related U.S. Application Data

[63] Continuation of Ser. No. 427,704, Oct. 27, 1989, abandoned.

[30] Foreign Application Priority Data

| Oct. 27, 1988 | [JP] | Japan | 63-271243 |
| Feb. 14, 1989 | [JP] | Japan | 1-34413 |
| Aug. 31, 1989 | [JP] | Japan | 1-225025 |

[51] Int. Cl.$^6$ ............................................. A61B 5/055
[52] U.S. Cl. ................................. 128/653.2; 324/309; 364/413.17
[58] Field of Search ........................ 128/653.2, 653.5; 324/309, 310, 311, 312; 364/413.13, 413.17

[56] References Cited

U.S. PATENT DOCUMENTS

| 4,431,968 | 2/1984 | Edelstein | 324/311 |
| 4,471,305 | 9/1984 | Crooks et al. | 324/314 |
| 4,486,708 | 12/1984 | Macovski | 324/312 |
| 4,532,474 | 7/1985 | Edelstein | 324/312 |
| 4,581,582 | 4/1986 | Redington | 324/309 |
| 4,710,876 | 12/1987 | Cline et al. | 364/414 |
| 4,733,187 | 3/1988 | Shimazaki et al. | 324/312 |
| 4,761,613 | 8/1988 | Hinks | 324/309 |
| 4,774,468 | 9/1988 | Bydder | 324/318 |
| 4,812,761 | 3/1989 | Vaughan, Jr. | 324/307 |
| 4,847,560 | 7/1989 | Sattin | 324/312 |
| 4,851,778 | 7/1989 | Kaufman et al. | 324/312 |
| 4,851,779 | 7/1989 | De Meester et al. | 324/312 |
| 4,875,012 | 10/1989 | Maeda et al. | 324/312 |
| 4,896,113 | 1/1990 | Pelc | 324/312 |
| 4,899,109 | 2/1990 | Tropp et al. | 324/320 |
| 4,902,973 | 2/1990 | Keren | 324/312 |
| 5,078,141 | 1/1992 | Suzuki et al. | 128/653.2 |
| 5,111,819 | 5/1992 | Hurd | 128/653.2 |
| 5,113,865 | 5/1992 | Maeda et al. | 128/653.2 |
| 5,207,715 | 5/1993 | Fossel | 128/653.2 |
| 5,247,936 | 9/1993 | Hagiwara | 128/653.2 |

FOREIGN PATENT DOCUMENTS

| 59-85651 | 5/1984 | Japan . |
| 60-63038 | 4/1985 | Japan . |
| 61-35339 | 2/1986 | Japan . |
| 62-179445 | 8/1987 | Japan . |

OTHER PUBLICATIONS

Bydder et al., *MR Imaging: Clinical Use of the Inversion Recovery Seguence, Journal of Computer Assisted Temography*, 9(4):659–675, Jul./Aug., 1985.

Porter et al., *STIR Imaging of Lymphadenopathy: Advantages Over Conventional Spin–Echo Techniques*, Scientific Program, 165(P):201, 1987.

Toshiba, "Magnetic Resonance Imaging System MRT–50A", Japan, (1989).

*Primary Examiner*—K. M. Pfaffle
*Attorney, Agent, or Firm*—Foley & Lardner

[57] ABSTRACT

An MRI system includes static and gradient field generators for respectively generating static and gradient fields to be applied to an object, a radio-frequency (RF) field transmitter/receiver for transmitting and receiving an RF field, a sequence controller for applying the gradient field and the RF field to the object at a predetermined timing while the object is being applied with the static field, thereby causing a predetermined MR phenomenon, a signal processor for performing predetermined processing of MR signal data detected through the RF field transmitter/receiver to obtain an MR image, and a display for displaying the image obtained by the signal processor. The sequence controller comprises a multi-slice controller for executing a multi-slice method using a sequence with a relatively long echo time so that an MR signal of a proton of a fat is suppressed and an MR signal of a proton of a CSF is emphasized. The signal processor comprises a summation processor for synthesizing multi-slice images as a plurality of slice images by summation to obtain a synthesized image.

24 Claims, 5 Drawing Sheets

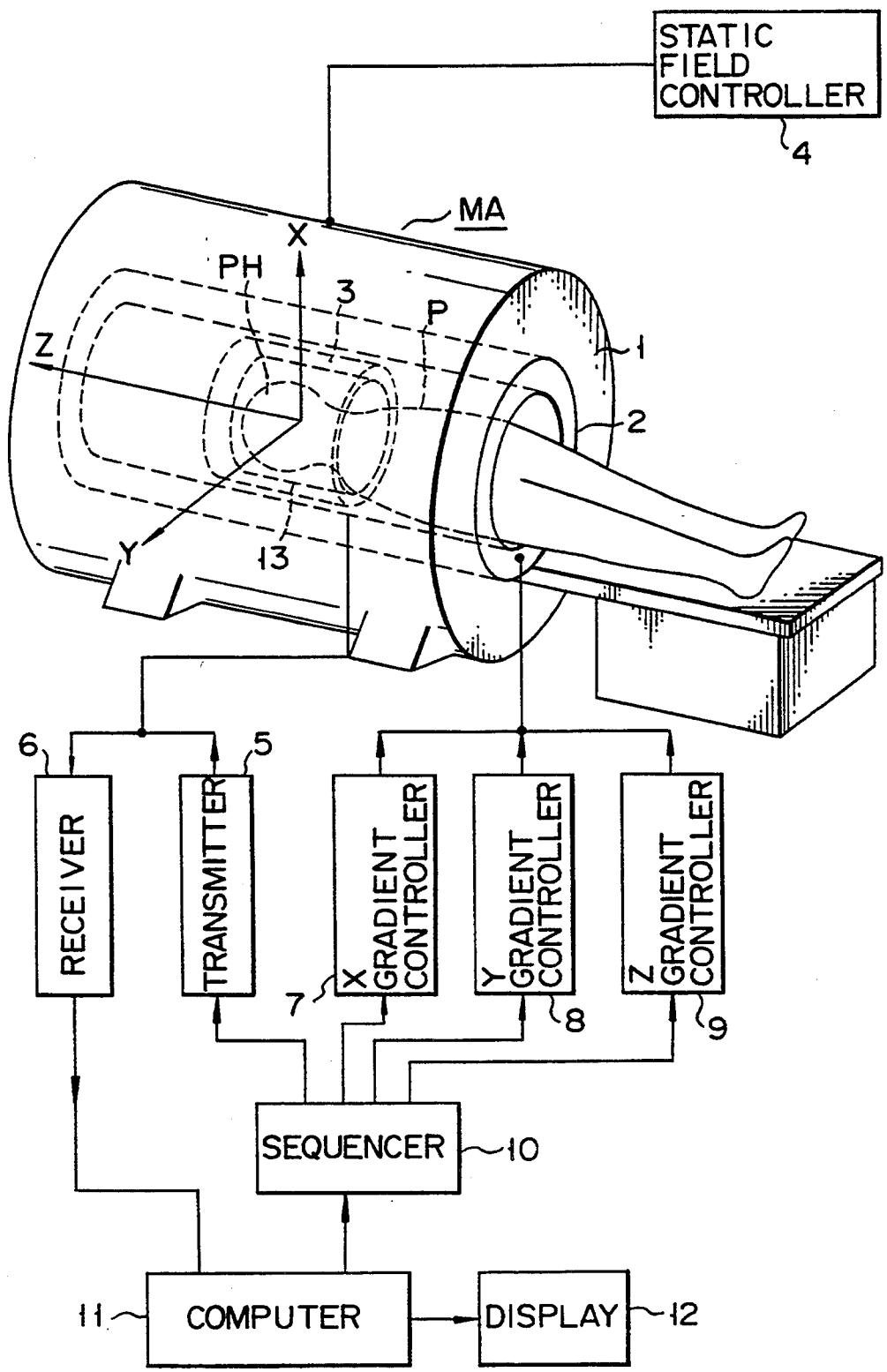
F I G. 1

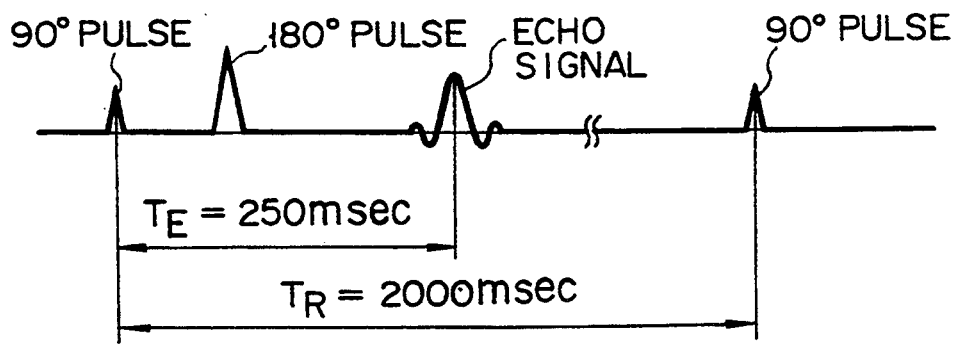
F I G. 2
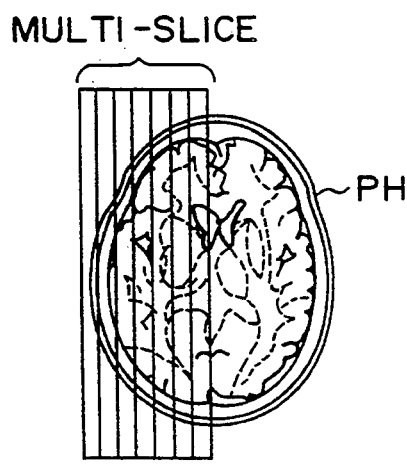
F I G. 3
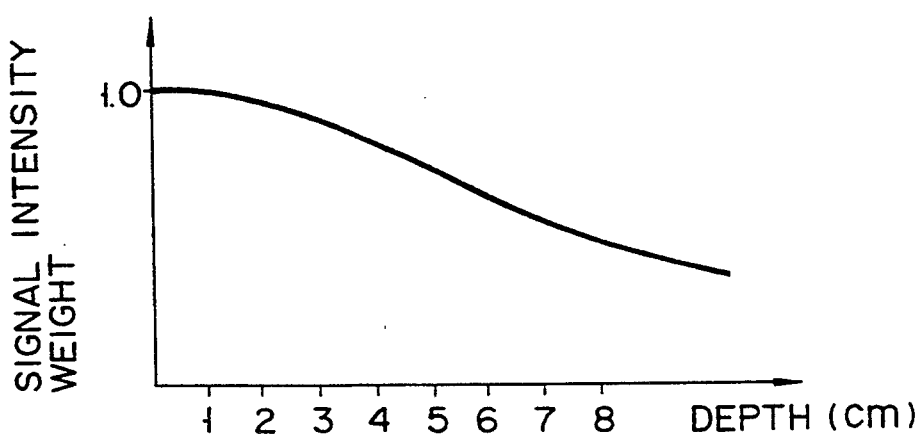
F I G. 4

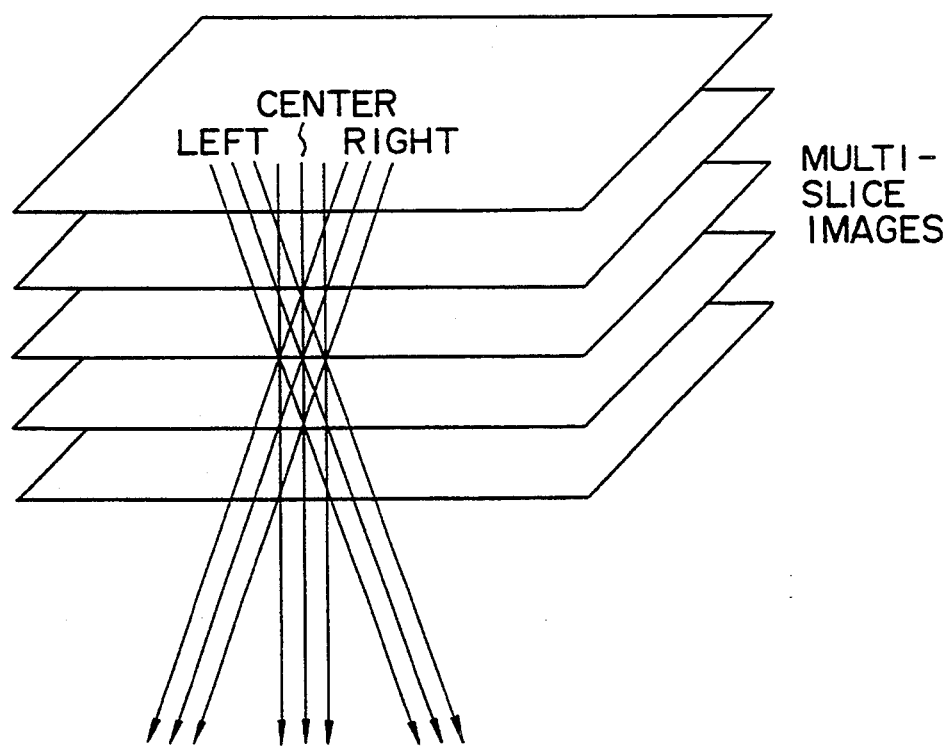
F I G. 7
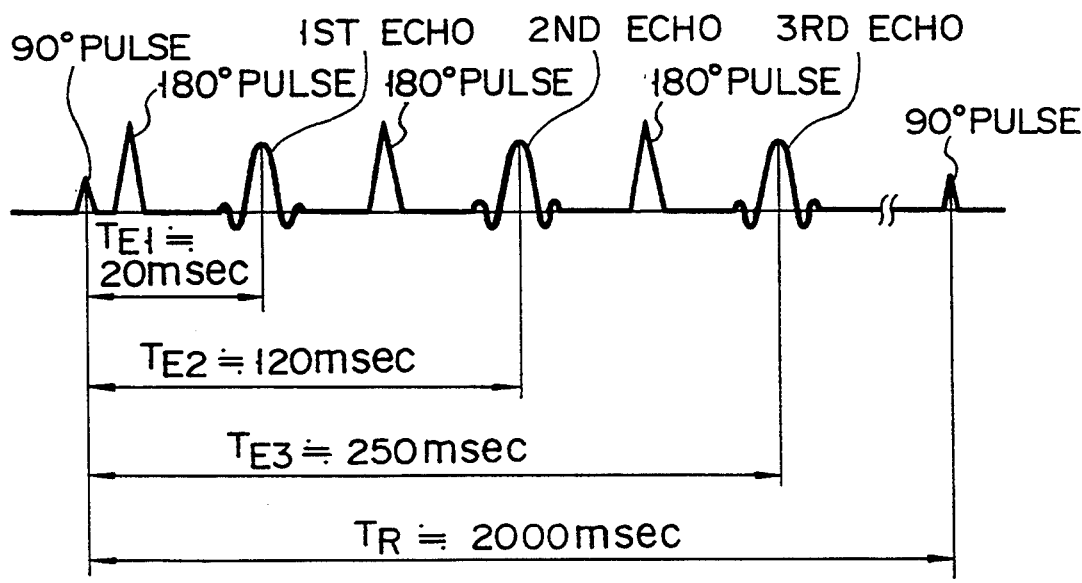
F I G. 9

MAGNETIC RESONANCE IMAGING SYSTEM

This application is a continuation of application Ser. No. 07/427,704, filed Oct. 27, 1989, now abandoned.

BACKGROUND OF THE INVENTION

1. Field of the Invention

The present invention relates to a magnetic resonance imaging (MRI) system for obtaining configuration data such as a density distribution image of a specific atomic nucleus of an object (e.g., a living subject) or function data such as a spectroscopy by utilizing a magnetic resonance (MR) phenomenon and, more particularly, to an MRI system for obtaining an image of a brain surface structure.

2. Description of the Related Art

In an MR phenomenon, a specific atomic nucleus having a non-zero spin and a magnetic moment based on the spin resonantly absorbs only an electromagnetic wave of a specific frequency in a static field. The atomic nucleus resonates at an angular frequency $\omega 0$ ($\omega 0 = 2\pi \nu 0$ $\nu 0$: Larmor frequency) given by the following equation:

$$\omega 0 = \gamma H0$$

where $\gamma$ is the gyromagnetic ratio unique to a type of atomic nucleus, and $H0$ is the static field strength.

In an MRI system for obtaining data for living subject diagnosis by utilizing the above phenomenon, a magnetic resonance (MR) signal as an electromagnetic wave having the same specific frequency as described above excited after resonance absorption is detected and is subjected to signal processing, thereby obtaining diagnosis data reflecting MR data such as an atomic nuclear density, a longitudinal relaxation time T1, a transverse relaxation time T2, a blood flow or flow of cerebrospinal fluid (CSF), or a chemical shift, e.g., a slice image of a selected slice of an object without invasion.

when diagnosis data is acquired by utilizing the MR phenomenon, MR signals induced by exciting every portion of an object placed in a static field can be acquired, in principle. In an actual system, however, due to limitations on a system configuration and clinical requirements for a diagnostic image, an MR phenomenon is excited in a specific, limited portion and MR signals therefrom are acquired.

In this case, the specific portion serving as an imaging object is a slice portion having a given thickness. MR signal data such as echo signals or free induction decay (FID) signals from this slice portion are acquired by executing a large number of MR excitation/data acquisition sequences, and these acquired data are subjected to image reconstruction processing by, e.g., a two-dimensional Fourier transformation method, thereby generating an MR image of the specific slice portion.

A clinical application using an MRI system will be described below. More specifically, in order to perform a surgical treatment, i.e., operation of an intracranial disease, a brain surface structure including cerebral grooves, serves as an important criterion upon detection of the position of a lesion locally present in or under a cortex. Therefore, it is desired to obtain an accurate position of the brain surface structure before an operation. In order to obtain the accurate position of the brain surface structure, some attempts are made to obtain a brain surface structure image representing the brain surface structure as well as the cerebral grooves. Such attempts will be explained below.

One of these attempts is a method of performing normal proton imaging using an appropriate head coil. In this method, a cylindrical coil which surrounds a head of a patient can be used as the head coil. When the head coil operates over the entire head, signals from the entire head are acquired. As a result, an image is obtained in which data of a deep portion under the brain surface are unnecessarily superposed. Therefore, it is not easy to discriminate the brain surface structure from such an image, and, hence, the above-mentioned diagnostic requirements cannot be satisfied.

Another attempt is a method of performing normal proton imaging using a surface coil. The surface coil exhibits a high sensitivity for only a portion adjacent to the coil. When this surface coil is used, only MR signals near a body surface can be acquired. Therefore, this method is often used in MRI when a portion of interest is present near the body surface. With this method, however, only signals from a subcutaneous fat of a surface layer portion are acquired according to the sensitivity characteristics of the surface coil, and the above-mentioned diagnostic requirements cannot be satisfied, either.

With the above-mentioned two methods, an image which can properly express a brain surface structure cannot be obtained.

In the conventional methods, MR data from, e.g. the CSF and MR data from a fatty area similarly acquired without being distinguished from each other. Therefore, it is difficult to obtain an effective brain surface structure image for diagnosing the position of a lesion locally present in or under a cortex.

SUMMARY OF THE INVENTION

It is an object of the present invention to provide an MRI system which can obtain an image representing an effective brain surface structure for diagnosing a lesion present in or adjacent to a brain surface.

An MRI system according to the present invention comprises static and gradient field generators for respectively generating static and gradient fields to be applied to an object, a radio-frequency (RF) field transmitter/receiver for transmitting and receiving an RF field, a sequence controller for applying the gradient field and the RF field to the object at a predetermined timing while the object is being applied with the static field, thereby causing a predetermined MR phenomenon, a signal processor for performing predetermined processing of MR signal data detected through the RF field transmitter/receiver to obtain an MR image, and a display for displaying the image obtained by the signal processor. The RF field transmitter/receiver comprises a cylindrical head coil, capable of surrounding a head of a patient as the object, for performing at least one of transmission and reception of the RF field to be applied to the object. The sequence controller comprises a multi-slice controller for executing a multi-slice method using a sequence with a relatively long echo time so that an MR signal of a proton of a fat is suppressed and an MR signal of a proton of a CSF is emphasized. The signal processor comprises a summation processor for synthesizing multi-slice images as a plurality of slice images by summation to obtain a synthesized image.

According to the MRI system of the present invention, MR signals from the CSF are emphasized, and MR signals from fatty area are suppressed upon detection. Therefore, an image of a brain surface structure based on the CSF of a head can be obtained without overlapping an image based on the fat, and is suitable for diagnosing a lesion present in or adjacent to a brain surface. In addition, since the image of the brain surface structure is obtained by processing three-dimensional data, the image of the brain surface structure viewed from various directions can be formed. With a weighted summation, the same effect as in the case of using a surface coil can be obtained, that is, superposition of strong signals from a deep structure such as ventricles of the brain can be prevented. In addition, an image suitable for stereoscopic viewing can be easily obtained by processing of the positional relationship upon summation.

BRIEF DESCRIPTION OF THE DRAWINGS

FIG. 1 is a block diagram showing an arrangement of an MRI system according to the first embodiment of the present invention;

FIG. 2 is a chart for explaining a pulse sequence in the embodiment shown in FIG. 1;

FIG. 3 is a view for explaining multi-slice images in the embodiment shown in FIG. 1;

FIG. 4 is a graph showing sensitivity characteristics of the surface coil and a corresponding weighting coefficient curve;

FIGS. 7 and 8 are views for explaining summation of different viewing directions;

FIG. 9 is a chart for explaining a pulse sequence according to the second embodiment of the present invention;

DETAILED DESCRIPTION OF THE PREFERRED EMBODIMENTS

Figure 5A:
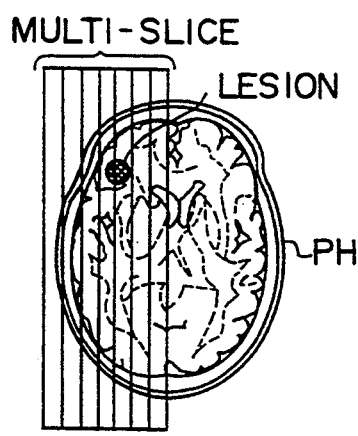
FIGS. 5A and 5B are views for explaining multi-slice images and a weighting coefficient in summation when a lesion is present at a relatively shallow position.

The first embodiment of an MRI system according to the present invention will be described hereinafter.

FIG. 1 shows the overall arrangement of an MRI system capable of imaging a brain surface structure according to the present invention.

A magnet assembly MA has almost a cylindrical shape so that an object (patient) P can be inserted in its hollow portion. The magnet assembly MA has a static magnetic field coil 1, a gradient field coil 2, and a whole-body probe 3. The static magnetic field coil 1 for generating a static field comprises a resistive or superconductive coil. The gradient field coil 2 generates X, Y, and Z gradient fields for giving position data of a portion where an MR phenomenon of MR signals is induced. The whole-body probe 3 comprises, e.g., transmission and reception coils, and is used for detecting induced MR signals while transmitting a radio-frequency (RF) rotary field. Typically, MR signals are MR echo signals or FID (free induction decay) signals.

The MRI system comprises a static field controller 4, a transmitter 5, a receiver 6, X, Y, and Z gradient controllers 7, 8, and 9, a sequencer 10, a computer system 11, and a display 12 in addition to the magnetic assembly MA described above. The static field controller 4 includes a static field power source, and is mainly used for performing energization control of the static field power source. The transmitter 5 transmits RF (radio frequency) pulses as an RF rotational field through the whole-body probe 3. The receiver 6 detects and receives the induced RF MR signals through the whole-body probe 3. The X, Y, and Z gradient controllers 7, 8, and 9 perform excitation control of the gradient field coil 2 for generating X, Y, and Z gradient fields. The sequencer 10 controls the transmitter 5 and the X, Y, and Z gradient controllers 7, 8, and 9 to execute a pulse sequence of the RF pulses and gradient field pulses for inducing an MR phenomenon and acquiring MR data. The computer system 11 controls the receiver 6 and the sequencer 10 and performs signal processing of the received signals. The display 12 is used for displaying an image generated by the computer system 11. When the static field coil 1 comprises a superconductive coil, the static field controller 4 may include a supply control of a coolant for cooling the superconductive coil. A permanent magnet may be used as a static field generating source in place of the static field coil 1 and the static field controller 4.

In the system of this embodiment, a head PH of the object P is located at the center of a magnetic field of the magnet assembly MA, and a cylindrical head coil 13 is arranged to surround the head PH. The head coil 13 is formed by adding or embedding a conductor (forming an appropriate coil such as a saddle coil or an elliptic coil) to or in a cylindrical or a substantially cylindrical support member. The head coil 13 is driven by the transmitter 5 and the receiver 6 to be able to transmit/receive RF signals in the same manner as in whole-body probe 3. Alternatively, for example, transmission of RF pulses may be performed by the whole-body probe 3, and reception of MR signals may be performed by the head coil 13.

In order to acquire MR data, the transmitter 5 is operated to apply RF pulses as RF rotational field from the transmission coil of the built-in type whole-body probe 3 or the head coil 13 to the object P. At the same time, the gradient controllers 7, 8, and 9 are operated to apply gradient fields Gx, Gy, and Gz as slice, phase-encode, and read gradient fields from the gradient field coil 2 to the object P. Thus, MR signals generated in a portion of the object P where an MR phenomenon is induced are acquired by the receiver 6 through the reception coil of the whole-body probe 3 or the head coil 13. Such an operation is executed a predetermined number of times to acquire a group of MR data. An MR image is generated based on the group of MR data.

As the pulse sequence for acquiring the MR data, a pulse sequence according to a spin echo method (a method of generating an echo signal upon application of a 180° pulse) or a field echo method (a method of generating an echo signal upon inversion of a read gradient field) is employed. Especially, a pulse sequence is employed wherein a proton (hydrogen atomic nucleus) in the head PH of the object P is used as an imaging object, and a multi-slice method is applied to a sequence with a relatively long echo time TE so that MR signals of a proton of a fat are suppressed and MR signals of a proton of a CSF are emphasized. Since the MR signal of the proton of the CSF has a very long decay time, when the echo time TE is prolonged, the MR signal in which the proton of the CSF is emphasized can be obtained.

FIG. 2 exemplifies a pulse sequence by a single echo in the case of the spin echo method. When the spin echo method is employed, the echo time TE is preferably set to be longer than normal (about 80 msec), e.g., set to be 250 msec, and a pulse repetition interval TR is set to be about 2,000 to 3,000 msec (normally, about 500 msec).

When the field echo method is employed, the echo time TE is preferably set to be longer than normal (about 14 msec), e.g., set to be 20 to 30 msec, and the pulse repetition interval TR is set to be about 80 to 1,000 msec (normally, about 50 msec). In addition, a flip angle of an RF pulse is set to be 10° to 20°.

FIG. 2 shows a 90° pulse, a 180° pulse, and an MR echo signal in a given encode step, and the first 90° pulse in the next encode step in a series of sequences as repetition of encode steps. The multi-slice method is applied to the sequence shown in FIG. 2 to acquire MR data for a plurality of predetermined slices.

According to this sequence, RF pulses are transmitted to the object P by the transmission coil of the whole-body probe 3 or the head coil 13 while a slice gradient field Gs is being applied from the gradient field coil 2 to the object P. Thereafter, a phase-encode gradient field Ge whose strength gradually changes in units of encode steps, and a read gradient field Gr are applied to the object P, and MR signals generated from a plurality of slice portions are acquired by the head coil 13 for the echo time TE. This operation is repeated a predetermined number of times corresponding to the required number of encode steps. As a result, a group of acquired MR data are supplied to the computer system 11, and multi-slice image data for the left half of the head of the object P is generated based on the group of data, as shown in FIG. 3. The multi-slice image data is subjected to summation by a method (to be described later) in the computer system 11, thus obtaining an image obtained by summation, i.e., a brain surface structure image, and original multi-slice images. These images are displayed on the display 12.

The summation of multi-slice images in the system of the present invention will be described below.

Summation methods 1, 2, and 3 to be described below are methods of obtaining sensitivity characteristics similar to those of a surface coil and obtaining a signal suppression effect according to the position (depth) of a lesion (region of interest). A summation method 4 is a method of obtaining an image for stereoscopic viewing.

(Summation Method 1)

N multi-slice images are represented by $Mk(i,j)$ (where $k=1, 2, \ldots, N$, and $i,j=1$ to 256 (matrix)).

An image obtained by weighting and summing these images is represented by $S(i,j)$.

$$S(i,j) = \sum_{k=1}^{N} ak \cdot Mk(i,j)$$

where ak is a weighting coefficient having a value corresponding to the sensitivity of the surface coil. More specifically, FIG. 4 is a graph showing the relationship between the depth and the sensitivity of the surface coil. For example, if a lesion is present at a position separated from a coil (head coil 13) by about 5 cm and is to be clearly represented in substantially the same characteristics as that in a case wherein a surface coil is used, the coefficient ak is calculated in accordance with FIG. 4 as follows:

a1=1.0, a2=0.9, a3=0.75, a4=0.6, a5=0.5, ...

More specifically, the value of the weighting coefficient ak for each slice image is selected to be smaller as the slice position becomes deeper. When multi-slice images based on MR data which are acquired in a sequence which is originally set to suppress MR signals of protons of fat are subjected to such weighted summation, signals from a deep portion such as ventricles of the brain or a basement membrane are suppressed, and as a result, the image of the surface brain structure is obtained in which an image of the brain surface structure, e.g., cerebral grooves based on signals from a shallow portion is emphasized. Since an image based on signals from a shallow portion is emphasized, an image based on signals from a deep portion is prevented from overlapping the image of the brain surface structure, and the brain surface structure will not become difficult to discriminate. When weighting is performed in this manner, an image can be obtained as if it were observed from a side of a higher weight.

Therefore, the display 12 displays an image which represents the brain surface structure such as brain grooves without overlapping other unnecessary portions. Thus, diagnostic data in which the positional relationship between the brain surface and the lesion is clear and is very clinically effective can be obtained.

(Summation Method 2)

In the summation method 1, the same characteristics as those of the surface coil are simply obtained. In the summation method 2, however, almost the same characteristics as those of a surface coil are obtained, and the value of the weighting coefficient ak is appropriately selected in accordance with the position (depth) of a lesion.

Figure 5B:
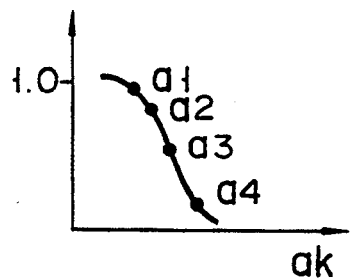

More specifically, as shown in FIG. 5A, when a lesion is present at a relatively shallow position, the value of the weighting coefficient ak is set to be smaller in comparison with a slice at a deeper position, and the rate of decrease in the weighting coefficient ak as a function of increase in depth is set to be larger. For example, the weighting coefficient ak is selected such that a1=1.0, a2=0.9, a3=0.6, a4=0.2, ..., as shown in FIG. 5B. When the weighting coefficient is selected in this manner, MR signals of the CSF from slices at deeper positions such as the ventricles of the brain are suppressed. Therefore, superposition of signals can also be suppressed. As a result, a summed image can clearly represent the brain surface structure including the lesion present at a shallow position.

Figure 6A:
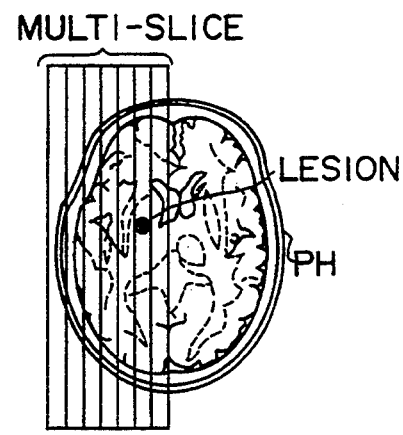
FIGS. 6A and 6B are views for explaining multi-slice images and a weighting coefficient in summation when a lesion is present at a relatively deep position.
Figure 6B:
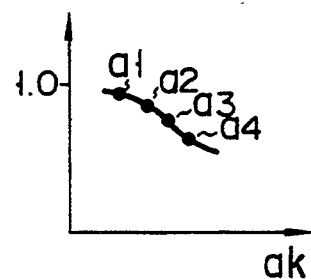

Contrary to the above case, as shown in FIG. 6A, when a lesion is present at a deep position, a rate of decrease in weighting coefficient ak as a function of increase in depth is set to be smaller. For example, the weighting coefficient ak is selected such that a1=1.0, a2=0.95, a3=0.8, a4=0.7. ..., as shown in FIG. 6B.

(Summation Method 3)

In the summation methods 1 and 2 described above, the entire slice image of each slice is weighted by the same weighting coefficient ak. In the summation method 3, however, the weighting coefficient ak is individually set for pixels of matrix (i,j) as constituting elements of each slice image.

$$S(i,j) = \sum_{k=1}^{N} ak(i,j) \cdot Mk(i,j)$$

For example, when a brain surface is to be especially emphasized, the weighting coefficient ak is selected as follows, so that a higher weight is provided to a semispherical shell portion near the brain surface:

$$ak(i,j) = \sqrt{(k-N)^2/N^2 + (i-128)^2/128 + (j-128)^2/128}$$

where k=1, 2, 3, ..., N, and i and j=1, 2, 3 ... 256.

(Summation Method 4)

The summation method 4 is a method of allowing stereoscopic viewing by utilizing summation. Upon weighted summation in the summation method 1, 2, or 3, since slice images are added while offsetting their positions, as shown in FIG. 7, a viewing direction can be changed to the left, center, and right. The positions of slice images upon summation are offset to coincide with binocular viewing directions to obtain a pair of images. Therefore, a pair of images for stereoscopic viewing can be obtained based on only a pair of multi-slice images without scanning two images by changing the viewing direction.

More specifically, offsets Δi and Δj in i and j directions of each slice are given, and an image S'(i,j) in a different viewing direction is formed by the following equation:

$$S(i,j) = \sum_{k=1}^{N} ak \cdot Mk(i + k(\Delta i), j + k(\Delta j))$$

In this case, if the offsets Δi and Δj are not integers, interpolation, e.g., linear interpolation is performed to perform summation, thereby generating an image in a specific viewing direction.

Figure 8:
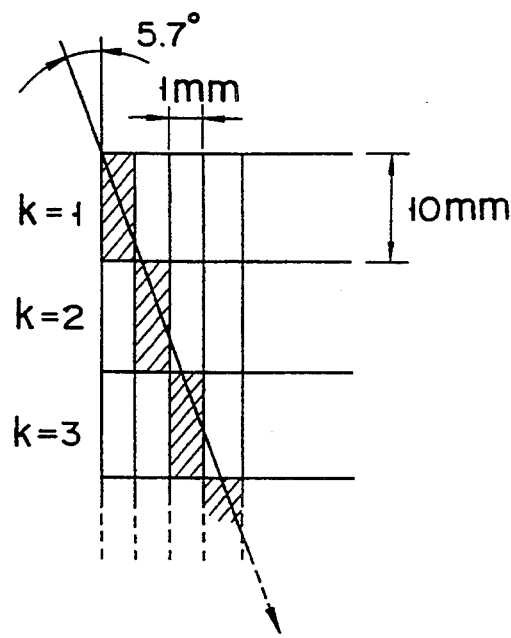

Assume that a pitch of a pixel of images Mk(i,j) is 1 mm, and a slice depth or slice thickness is 10 mm. If Δi=1 (i.e., 1 mm) and Δj=0, the viewing direction is offset by about 5.7° (=tan$^{-1}$1/10), as shown in FIG. 8. Thus, stereoscopic viewing is attained by using the images S and S'.

Weighting in summation for generating images of the brain surface structure when the stereoscopic viewing is performed can be performed in the same manner as described above. In stereoscopic viewing, since the positional relationship between images can be relatively easily recognized, weighting need not always be performed.

As a display method of allowing stereoscopic recognition, a plurality of images having slightly different viewing directions are reciprocally displayed in an animation-like manner so that images visually swing to allow stereoscopic viewing in addition to a method of utilizing the parallax of two eyes. In this case, when the positions of a plurality of slices need only be offset when they are summed, a large number of images having different viewing directions can be easily obtained. Therefore, a merit of the present invention is very effectively utilized.

The present applicant has proposed a patent associated with the present invention. The invention of the prior application (U.S. patent application Ser. No. 343,635) is to obtain the same surface structure image as in this embodiment by the spin echo method in which a surface coil is used, a large slice thickness of about 8 cm is set, the echo time is set to be longer (250 msec) than normal, and the pulse repetition interval TR is set to be longer (2,000 msec) than normal.

As compared to the invention in the prior application, the embodiment of the present invention has the following advantages. That is, in the prior application, an image to be picked up is limited by the position of the surface coil and the direction of a magnetic field. However, in the present invention, there are no such special limitations, and an image of the surface brain structure viewed from a desired direction can be obtained. Since the head coil is used, setting is facilitated. By referring to a summed image and slice images, the positional relationship in the depth direction can be easily determined. The weighting coefficients are appropriately adjusted in accordance with the position of a lesion or a case of disease, thereby obtaining a brain surface structure image appropriately representing the position of the lesion or the case of disease. A pair of images for performing stereoscopic viewing can be easily obtained without performing rescanning with a different viewing direction. Since the slice thickness is small, a pixel upon imaging is small, and, hence, a phase error is small. Therefore, degradation of MR signals is small.

In the prior application described above, when the pulse repetition interval TR is set to be 2 sec and encoding of 256 steps is to be performed, data acquisition requires 2×256=512 sec. In this embodiment, however, since the pulse repetition interval TR can be 80 to 1,000 msec when the field echo method is employed, data acquisition requires only 0.08×256=20.48 to 1.0×256=256 sec. Therefore, MR data can be acquired within a very short time.

In the above embodiment, since the single echo method for obtaining one MR echo signal in one encode step is used, N steps of encoding are required to perform imaging of an N×N matrix. Contrary to this, the multi echo method of obtaining a plurality of MR echo signals in one encode step can be used, and the above-mentioned method can be applied to obtain echo signals in the multi-echo method.

This is the second embodiment of the present invention, and FIG. 9 shows a pulse sequence in one encode step.

In the embodiment shown in FIG. 9, a third echo signal is generated at the same timing as the echo signal shown in FIG. 2. In FIG. 9, a first echo signal has an echo time TE of about 20 msec, and a second echo signal has an echo time TE of about 120 msec. The repetitive time TR of these signals is set to be 2,000 to 3,000 msec as in FIG. 2. When N steps of encoding are performed to perform imaging of an N×N matrix using the sequence shown in FIG. 9, an image with an emphasized nuclear spin density can be obtained when the first echo signal is used. When the second echo signal is used, an image with an emphasized time constant T2 can be obtained. Therefore, the first and second echo signals can be used for obtaining an image conventionally used for clinical examinations. The third echo signal can be used for obtaining an image of the brain surface structure.

In this manner, a sequence for obtaining a normal image can be executed simultaneously with execution of a sequence for obtaining the image of the brain surface structure, and encoding can be commonly performed for both the images. Therefore, a series of sequences need only be executed once to simultaneously obtain the image of the brain surface structure and a normal image. In the multi-echo method shown in FIG. 9, the number of slices of multi-slice images can be set to be about 6.

In the multi-echo method, the number of echo signals obtained in one encode step is not limited to three. For example, two echo signals may be obtained in one encode step or four or more echo signals may be obtained in one encode step.

For example, when two echo signals are obtained in one encode step, a normal image is obtained using a first echo signal having an echo time TE of about 120 msec, and an image of a brain surface structure is obtained using a second echo signal having an echo time TE of about 250 msec.

When four echo signals are obtained in one encode step, normal images are obtained using a first echo signal having an echo time TE of about 40 msec, a second echo signal having an echo time TE of about 80 msec, and a third echo signal having an echo time TE of about 120 msec, and an image of a brain surface structure is obtained using a fourth echo signal having an echo time TE of about 250 msec.

In order to increase the number of slices for obtaining the image of the brain surface structure to be larger than 6, the following sequence is executed.

Normal images are obtained using a first echo signal having an echo time TE of about 20 msec and a second echo signal having an echo time TE of about 80 msec, and the image of the brain surface structure is obtained using a third echo signal having an echo time TE of about 250 msec. In addition, the repetitive time TR is set to be about 3,000 msec. Then, multi-slice imaging of about 10 slices can be realized.

In another method, normal images are obtained using a first echo signal having an echo time TE of about 20 msec and a second echo signal having an echo time TE of about 120 msec, and the image of the brain surface structure is obtained using a third echo signal having an echo time TE of about 200 msec. In addition, the repetitive time TR is set to be about 2,000 msec. With this method, multi-slice imaging of about 8 slices can also be realized. However, since the third echo signal having the echo time TE of about 200 msec is used upon imaging of the brain surface structure, the contrast of the image of the brain surface structure is slightly decreased to be lower than in a case wherein the echo signal having the echo time TE of about 250 msec is used. However, there is no practical problem.

Figure 10:
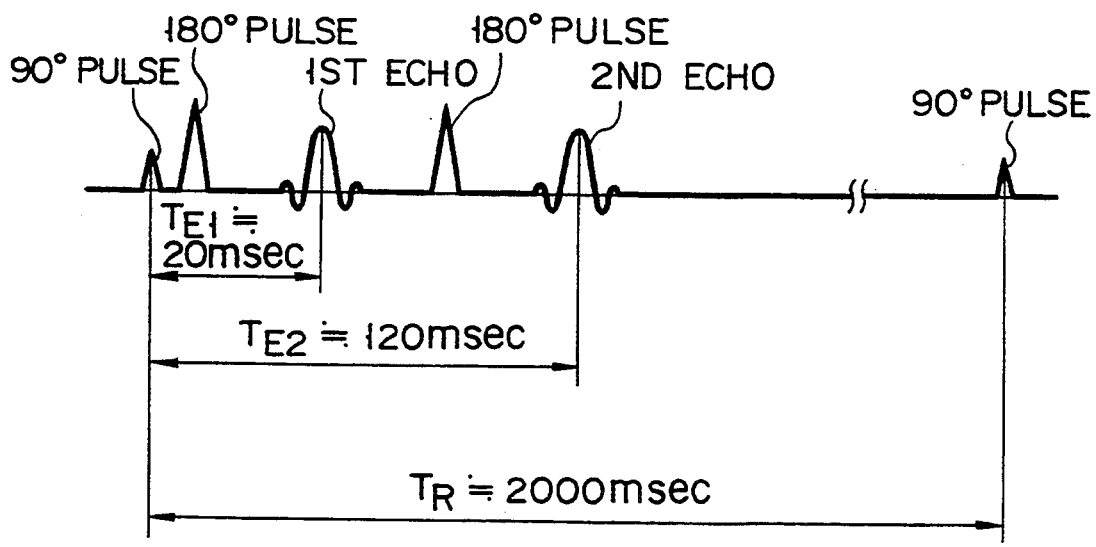
FIG. 10 is a chart for explaining a pulse sequence according to the third embodiment of the present invention.

In the third embodiment shown in FIG. 10, normal images are obtained using a first echo signal having an echo time TE of about 20 msec and a second echo signal having an echo time TE of about 120 msec, and the second echo signal having the echo time TE of about 120 msec used for obtaining the normal image is also used for obtaining an image of a brain surface structure. In addition, a repetitive time TR is set to be about 2,000 to 3,000 msec. In this manner, the image of the brain surface structure can be obtained by data processing of the second echo signal without modifying the sequence of conventional multi-slice imaging.

Of course, the field echo method may be employed in place of the spin echo method, and the normal image and the brain surface structure image can be simultaneously obtained in the same manner as described above.

Figure 11:
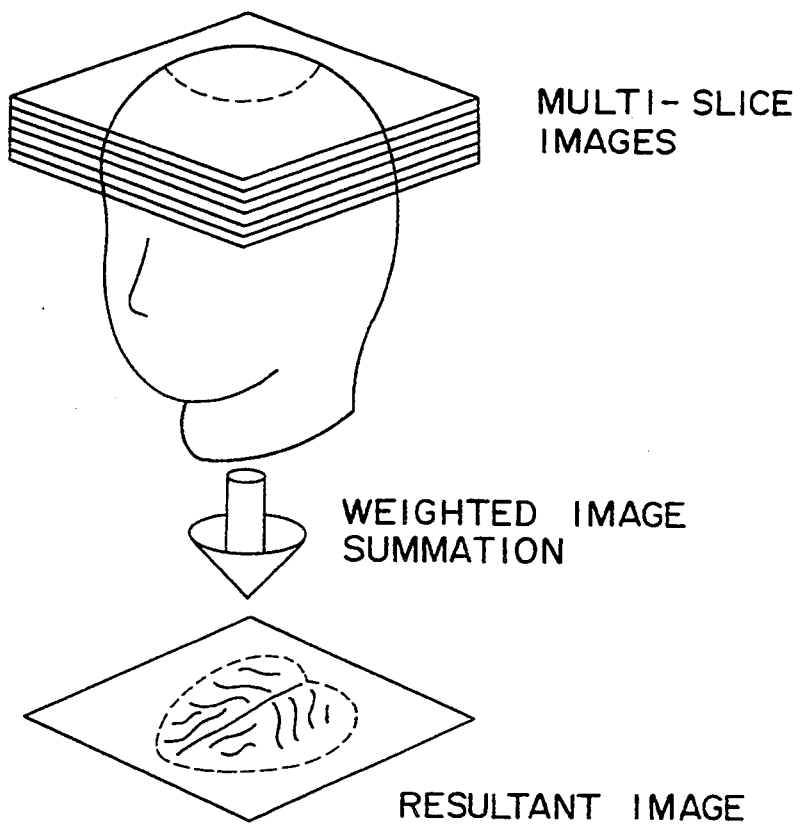
FIG. 11 is a view showing multi-slice images different from those in FIG. 3.

As shown in FIG. 11, multi-slice images corresponding to an upper half portion of the brain are obtained and are subjected to weighted summation, thus obtaining an image of the upper half portion of the brain surface structure. In this manner, multi-slice images of an arbitrary portion are subjected to weighted summation, thus obtaining an image more effective for diagnosis.

Various other changes and modifications may be made within the spirit and scope of the invention.

For example, MR data of a predetermined head region may be obtained using a 3DFT (3-dimensional Fourier transform) method in place of the multi-slice method.

What is claimed is:

1. A magnetic resonance imaging system comprising:
    static field generating means for generating a static field to be applied to a head of a human forming an object to be examined;
    gradient field generating means for generating a gradient field to be applied to the head of the human object;
    radio-frequency field transmitting means for transmitting a radio-frequency field to be applied to the head of the human object;
    receiving means for receiving a radio-frequency magnetic resonance signal from the head of the human object;
    sequence control means for driving said gradient field generating means, said radio-frequency field transmitting means and said receiving means in accordance with a predetermined sequence while the static field is applied from said static field generating means to the head of the human object, thereby applying the gradient field and the radio-frequency field to the head of the human object at a predetermined timing, and causing a predetermined magnetic resonance phenomenon in the head of the human object;
    signal processing means for performing predetermined processing of magnetic resonance signal data generated as a result of an operation of said sequence control means and received through said receiving means so as to obtain a magnetic resonance image; and
    display means for displaying the image obtained by said signal processing means,
    wherein said receiving means comprises head coil means for receiving the magnetic resonance signal, said sequence control means comprising multi-slice control means for executing a multi-slice method using a sequence with a relatively long echo time so that a magnetic resonance signal of a proton of fat is suppressed and a magnetic resonance signal of a proton of cerebrospinal fluid is emphasized, and said signal processing means comprises weighting summation processing means including means for setting a weighting coefficient to be smaller for a slice at a deeper position as compared to a more shallow position in order to produce weighted multi-slice images and means for summing said weighted multi-slice images so as to produce an image of a brain surface of the head.

2. A system according to claim 1, wherein said weighting summation processing means uses predetermined weighting coefficients for each slice image.

3. A system according to claim 1, wherein said weighting summation processing means uses predetermined weighting coefficients for each pixel of each slice image.

4. A system according to claim 1, wherein said weighting summation processing means includes means for setting weighting coefficients corresponding to sensitivity characteristics of said head coil means.

5. A system according to claim 1, wherein said weighting coefficients emphasize a portion near the brain surface of the head and at a position near a depth level in the human brain where a region of interest is present.

6. A system according to claim 1, wherein said weighting summation processing means includes offset summation means for summing the multi-slice images while offsetting a positional relationship of the slice images in accordance with a desired viewing direction.

7. A system according to claim 6, wherein said weighting summation processing means further includes means for obtaining a pair of summed images for stereoscopic viewing having a parallax corresponding to a binocular parallax by summing the multi-slice images while offsetting at least a portion by said offset summation means in accordance with the desired viewing direction.

8. A system according to claim 6, wherein said weighting summation processing means further includes means for obtaining a plurality of summed images having different viewing directions by summing the multi-slice images while offsetting at least a portion by said offset summation means in accordance with the desired viewing direction.

9. A system according to claim 8, wherein said display means includes means for sequentially reciprocally displaying a plurality of summed images having said different viewing directions so as to visually swing the displayed images.

10. A magnetic resonance imaging system comprising:
   static field generating means for generating a static field to be applied to a head of a human forming an object to be examined;
   gradient field generating means for generating a gradient field to be applied to the head of the human object;
   radio-frequency field transmitting means for transmitting a radio-frequency field to be applied to the head of the human object;
   receiving means for receiving a radio-frequency magnetic resonance signal from the head of the human object;
   sequence control means for driving said gradient field generating means, said radio-frequency field transmitting means and said receiving means in accordance with a predetermined sequence while the static field is applied from said static field generating means to the head of the human object, thereby applying the gradient field and the radio-frequency field to the head of the human object at a predetermined timing, and causing a predetermined magnetic resonance phenomenon in the head of the human object;
   signal processing means for performing predetermined processing of magnetic resonance signal data generated as a result of an operation of said sequence control means and received through said receiving means so as to obtain a magnetic resonance image; and
   display means for displaying the image obtained by said signal processing means,
   wherein said receiving means comprises head coil means for receiving the magnetic resonance signal, said sequence control means comprising multi-slice control means for executing a multi-slice method using a sequence which combines a sequence in which a magnetic resonance signal of a proton of fat is suppressed, in each encode step of said sequence by said multi-slice method by using a multi-echo method, and said signal processing means comprises weighting summation processing means including means for setting a weighting coefficient to be smaller for a slice at a deeper position as compared to a more shallow position in order to produce weighted multi-slice images and means for summing said weighted multi-slice images so as to produce an image of a brain surface of the head.

11. A method for acquiring an image representing a brain surface of a head in a magnetic resonance imaging apparatus, the method comprising the steps of:
   a first step of executing a multi-slice method using a sequence with a relatively long echo time so that a magnetic resonance signal of a proton of fat is suppressed and a magnetic resonance signal of a proton of cerebrospinal fluid is emphasized; and
   a second step of weighting summation processing by setting a weighting coefficient to be smaller for a slice at a deeper position in the brain as compared to a more shallow position in order to weight each multi-slice image and summing said weighted multi-slice images so as to produce an image of a brain surface of the head.

12. A method according to claim 11, wherein the weighting summation processing step comprises the step of weighting the multi-slice images with predetermined weighting coefficients for each slice image.

13. A method according to claim 11, wherein the weighting summation processing step comprises the step of weighting the multi-slice images with predetermined weighting coefficients for each pixel of the slice images.

14. A method according to claim 11, wherein the weighting summation processing step comprises the step of setting weighting coefficients corresponding to sensitivity characteristics of a head coil means.

15. A method according to claim 11, wherein the weighting summation processing step comprises the step of setting weighting coefficients for emphasizing a portion near the brain surface and at a position near a depth level where a region of interest is present.

16. A method according to claim 11, wherein the second step includes the offset summation step of summing the multi-slice images while offsetting a positional relationship of the slice images in accordance with a desired viewing direction.

17. A method according to claim 16, wherein the second step further includes the step of obtaining a pair of summed images for stereoscopic viewing having a parallax corresponding to a binocular parallax by summing the multi-slice images while offsetting at least a portion by the offset summation step in accordance with the desired viewing direction.

18. A method according to claim 16, wherein the second step further includes the step of obtaining a plurality of summed images having different viewing directions by summing the multi-slice images while off-setting at least a portion by the offset summation step in accordance with the desired viewing direction.

19. A method according to claim 18, further including the step of sequentially reciprocally displaying a plurality of summed images having said different viewing directions so as to visually swing the displayed images.

20. A method for acquiring an image representing a brain surface of a head in a magnetic resonance imaging apparatus, the method comprising the steps of:
a first step of executing a multi-slice method combining a sequence, in which a magnetic resonance signal of a proton of fat is suppressed, in each encode step of said sequence by said multi-slice method by using a multi-echo method; and
a second step of weighting summation processing by setting a weighting coefficient to be smaller for a slice at a deeper position in the brain as compared to a more shallow position in order to weight each multi-slice image and summing said weighted multi-slice images so as to produce an image of a brain surface of the head.

21. A magnetic resonance imaging system comprising:
static field generating means for generating a static field to be applied to a head of a human forming an object to be examined;
gradient field generating means for generating a gradient field to be applied to the head of the human object;
radio-frequency field transmitting means for transmitting a radio-frequency field to be applied to the object;
receiving means for receiving a radio-frequency magnetic resonance signal from the head of the human object;
sequence control means for driving said gradient field generating means, said radio-frequency field transmitting means and said receiving means in accordance with a predetermined sequence while the static field is applied from said static field generating means to the head of the human object, thereby applying the gradient field and the radio-frequency field to the head of the human object at a predetermined timing, and causing a predetermined magnetic resonance phenomenon in the head of the human object;
signal processing means for performing predetermined processing of magnetic resonance signal data generated as a result of an operation of said sequence control means and received through said receiving means so as to obtain a magnetic resonance image; and
display means for displaying the image obtained by said signal processing means,
wherein said receiving means comprises head coil means for receiving the magnetic resonance signal, said sequence control means comprising 3-dimensional Fourier transform control means for executing a 3-dimensional Fourier transform method using a sequence with a relatively long echo time so that a magnetic resonance signal of a proton of fat is suppressed and a magnetic resonance signal of a proton of cerebrospinal fluid is emphasized, and said signal processing means comprises weighting summation processing means including means for setting a weighting coefficient to be smaller for a portion of the head of the human object at a deeper position in order to produce weighted 3-dimensional Fourier transformed images as compared to a more shallow position and means for summing said weighted 3-dimensional Fourier transformed images so as to produce an image of a brain surface of the head.

22. A method for acquiring an image representing a brain surface of a head in a magnetic resonance imaging apparatus, the method comprising the steps of:
a first step of executing a 3-dimensional Fourier transform method using a sequence with a relatively long echo time so that a magnetic resonance signal of a proton of fat is suppressed and a magnetic resonance signal of a proton of cerebrospinal fluid is emphasized; and
a second step of setting weighting coefficients to be smaller for portions of a head of a human object at deeper positions in order to produce weighted 3-dimensional Fourier transformed images as compared to more shallow positions and summing said weighted 3-dimensional Fourier transformed images so as to produce an image of a brain surface of the head.

23. A magnetic resonance imaging system utilizing 3-dimensional Fourier transform imaging to produce image data, the system comprising:
static field generating means for generating a static field to be applied to an object in the form of a human head;
gradient field generating means for generating a gradient field to be applied to the object;
radio-frequency field transmitting means for transmitting a radio-frequency field to be applied to the object;
receiving means for receiving a magnetic resonance signal from the object;
sequence control means for driving said gradient field generating means, said radio-frequency field transmitting means and said receiving means in accordance with a predetermined sequence while the static field is applied from said static field generating means to the object, thereby applying the gradient field and the radio-frequency field to the object at a predetermined timing, and causing a predetermined magnetic resonance phenomenon in the object;
signal processing means for performing predetermined processing of magnetic resonance signal data generated as a result of an operation of said sequence control means and received through the receiving means so as to obtain a magnetic resonance image; and
display means for displaying the image obtained by said signal processing means,
wherein said receiving means comprises head coil means for receiving the magnetic resonance signal, said sequence control means obtaining said image data by using a sequence with a relatively long echo time so that a magnetic resonance signal of a proton of fat is suppressed and a magnetic resonance signal of a proton of cerebrospinal fluid is emphasized, and said signal processing means comprises weighting summation processing means having means for setting weighting coefficients to be smaller for portions of the head at deeper positions as compared to more shallow positions and means for summing weighted image data so as to produce an image of a brain surface of the head.

24. A method for acquiring an image representing a brain surface of a head in a magnetic resonance imaging apparatus, the method comprising the steps of:

a first step of obtaining image data by using a sequence with a relatively long echo time so that a magnetic resonance signal of a proton of fat is suppressed and a magnetic resonance signal of a proton of cerebrospinal fluid is emphasized; and a second step of setting weighting coefficients to be smaller for portions of the head at deeper positions as compared to more shallow positions in order to produce weighted image data; and a third step of summing said weighted image data so as to produce an image of a brain surface of the head.

* * * * *